United States Patent
Ogasawara

(10) Patent No.: US 7,236,039 B2
(45) Date of Patent: Jun. 26, 2007

(54) SPREAD SPECTRUM CLOCK GENERATING APPARATUS

(75) Inventor: Kazuo Ogasawara, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 24 days.

(21) Appl. No.: 11/289,599

(22) Filed: Nov. 30, 2005

(65) Prior Publication Data

US 2006/0076997 A1    Apr. 13, 2006

(30) Foreign Application Priority Data

Dec. 8, 2004    (JP)    ............... 2004-354862

(51) Int. Cl.
*H03K 3/00*    (2006.01)

(52) U.S. Cl. .............. 327/291; 327/298; 327/114

(58) Field of Classification Search ............. None
See application file for complete search history.

(56) References Cited

U.S. PATENT DOCUMENTS

| | | | | |
|---|---|---|---|---|
| 6,114,914 A | * | 9/2000 | Mar ............... | 331/16 |
| 6,380,774 B2 | * | 4/2002 | Saeki ............. | 327/119 |
| 7,054,404 B2 | * | 5/2006 | Saeki ............. | 375/376 |

FOREIGN PATENT DOCUMENTS

| | | |
|---|---|---|
| JP | 7-235862 | 9/1995 |
| JP | 2001-148690 | 5/2001 |
| JP | 2002-190724 | 7/2002 |

OTHER PUBLICATIONS

M. Sugawara et al., "1.5 Gbps, 5150 ppm Spread Spectrum SerDes PHY with a 0.3 mW, 1.5 Gbps Level Detector for Serial ATA", Symposium on VLSI Circuits Digest of Technical Paper 5-3, Jun. 2002.
S. Sidiropoulos and Mark Horowitz et al., "A semi-digital delay locked loop with unlimited phase shift capability and 0.08-400 MHz operating range," ISSCC 1997.
M. Aoyama et al., 3 Gbps, 5000 ppm Spread Spectrum SerDes PHY with frequency tracking Phase Interpolator for Serial ATA:, Symposium on VLSI Circuits Digest of Technical Paper 8-4, Jun. 2003.

* cited by examiner

*Primary Examiner*—Timothy P. Callahan
*Assistant Examiner*—An T. Luu
(74) *Attorney, Agent, or Firm*—McGinn IP Law Group, PLLC

(57) ABSTRACT

Disclosed is a spread spectrum clock generator comprising a phase interpolator, which receives a clock signal from a clock input terminal and a control signal (an up signal and/or down signal), for adjusting the phase of an output clock signal in accordance with said control signal and outputting the resultant clock signal, and a control circuit receiving and counting the clock signal that enters from the clock input terminal and outputting said control signal (up signal or down signal), which is for varying the phase of the output clock signal based upon the result of the count, to the phase interpolator. The phase of the output clock signal from the phase interpolator varies with time and the output clock signal is frequency-modulated within a prescribed frequency range. A changeover between absence and presence of a spread spectrum clock function is performed, without a sudden fluctuation in frequency, in accordance with a frequency-modulation start signal and frequency-modulation stop signal that enters from an SSC control terminal.

12 Claims, 12 Drawing Sheets

SPREAD SPECTRUM CLOCK GENERATING APPARATUS

FIELD OF THE INVENTION

This invention relates to a clock generating circuit and, more particularly, to a spread spectrum clock generator.

BACKGROUND OF THE INVENTION

When a clock generator in an electronic device generates a single frequency, emission increases at this frequency and higher harmonics. For this reason, use is made of a spread spectrum clock generator that reduces the peak of unnecessary emissions by frequency modulation and diminishes EMI (electromagnetic interference).

A PLL (phase-locked loop) in which a pulse-swallow frequency divider is provided in a feedback counter generally is used as a conventional spread spectrum clock generator of this kind (e.g., see Non-patent Document 1 below). This PLL implements frequency modulation by affording two integers A and A-1 as divider ratios and switching between A and A-1. By changing the proportions of A and A-1 at predetermined fixed intervals, average frequency f is varied to thereby generate a spread spectrum clock.

With a PLL having a pulse-swallow frequency divider provided in a feedback counter, a step phase error corresponding to a single clock pulse is introduced in the PLL as an input when the frequency divider is changed over. Since the PLL is in the negative feedback loop, a transient response is caused by the entered step phase error. It is expected that if the damping factor of the negative feedback loop is large, the clock frequency will vary out of specs owing to the transient response. If the damping factor is small, on the other hand, there is a possibility that the stability of the loop will be lost. Furthermore, since the characteristic of a spread spectrum clock generator is decided by control of the pulse-swallow frequency divider and the overall characteristic of transient response due to step phase error, a large number of design parameters exist and labor expended in optimizing design increases.

It should be noted that the PLL described in the above-cited reference is equipped with the pulse-swallow frequency divider and is so adapted that a smooth characteristic is obtained by using post-filtering. However, the reference is silent on information (measures) regarding a fluctuation in the PLL characteristic.

A spread spectrum clock generating circuit having a PLL, which is equipped with a plurality of program counters, and a frequency modulating circuit also is known (e.g., see Patent Document 2 below).

Also known is a clock generating apparatus comprising a clock generator for generating m-phase clock signals having a phase difference between them; a selection processor for successively selecting one of the m-phase clock signals generated by the clock generator to thereby generate a second clock signal; and a dithering controller for supplying the selection processor with a control signal so that the phase of the second clock signal obtained from the selection processor will fluctuate within a prescribed range and the peak of a spectrum will be dispersed (e.g., see Patent Document 1 below). The clock generating apparatus of this patent document is equipped with a delay circuit or ring oscillator as the m-phase clock generator. FIG. 12 is a diagram illustrating the configuration of the clock generator described in this patent document, the generator using a ring oscillator 110 to generate a 5-phase clock. As shown in FIG. 12, five inverting delay circuits 111 to 115 are connected in ring form and clocks c0 to c4 of five phases are extracted from the outputs of the respective delay circuits via buffers 116 to 120, respectively. Reference numerals 121 to 125 denote frequency divider circuits.

In the prior art in which plural (m) clock generators such as a plurality of delay circuits are used in generating multiple-phase (m-phase) clock signals, as described in Patent Document 1, the amount of delay in the delay circuits fluctuates owing to changes in power-supply voltage and operating temperature, etc., if the delay circuits are constructed in an integrated circuit. Accordingly, a clock generator of m different phases requires the provision of delay circuits of m or more phases for the purpose of accommodating for the amount of fluctuation. As a consequence, control is complicated and it is necessary to finely adjust the amount of delay of the delay circuits.

Further, with the arrangement described in Patent Document 1, m (five in FIG. 12) clock generators are provided to deal with phase lead or lag of the clock. When the phase of a clock makes one full cycle, a smooth, seamless transition is desired with the same amount of delay. However, it is difficult to achieve a smooth, seamless transition owing to the fine adjustment of amount of delay and the use of m or more clock generators.

In a case where clocks of m different phases are generated by the ring oscillator 110, as shown in FIG. 8, this is technically feasible when the number of m-phase ring oscillators is small. In order to stabilize frequency, however, PLL (phase-locked loop) techniques are required. Further, if it is attempted to finely adjust phase resolution by increasing the number of clock generators for m different phases, the oscillating frequency of the ring oscillator will decline and the required frequency will no longer be obtained.

Also known is a clock generating apparatus having a phase interpolator and a control circuit to which a clock signal that enters from a clock input terminal is input for counting this clock signal and outputting a control signal, which is for varying the phase of an output clock signal based upon the result of the count, to the phase interpolator, wherein the phase of the output clock signal from the phase interpolator varies with time and frequency modulation is performed within a prescribed range of frequencies (e.g., see Non-patent Document 3 below).

[Non-patent Document 1]

M. Sugawara, T. Ishibashi, K. Ogasawara, M. Aoyama, M. Zwerg, S. Glowinski, Y. Kameyama, T. Yanagita, M. Fukaishi, S. Shimoyama, T. Ishibashi and T. Noma, "1.5 Gbps, 5150 ppm Spread Spectrum SerDes PHY with a 0.3 mW, 1.5 Gbps Level Detector for Serial ATA", Symposium on VLSI Circuits Digest of Technical Paper 5-3, FIG. 1, June/2002

[Non-patent Document 2]

S. Sidiropoulos and Mark Horowitz et al., "A semi-digital delay locked loop with unlimited phase shift capability and 0.08–400 MHz operating range," ISSCC 1997 pp. 332–333

[Non-Patent Document 3]

M. Aoyama, K. Ogasawara, M. Sugawara, T. Ishibashi, T. Ishibashi, S. Shimoyama, K. Yamaguchi, and T. Yanagita, "3 Gbps, 5000 ppm Spread Spectrum SerDes PHY with frequency tracking Phase Interpolator for Serial ATA", Symposium on VLSI Circuits Digest of Technical Paper 8-4, FIG. 2, June/2003

[Patent Document 1]
Japanese Patent Kokai Publication No. JP-P2001-148690A (pages 3 and 10 and FIGS. 3 and 11)

[Patent Document 2]
Japanese Patent Kokai Publication No. JP-A-7-235862 (pages 9, 10 and FIGS. 6, 7, 8 and 9)

[Patent Document 3]
Japanese Patent Kokai Publication No. JP-P2002-190724A (pages 8–9 and FIG. 6)

Further, there is now a demand for operation in which the spread spectrum function is halted temporarily when a system is operating on a spread spectrum clock and the spread spectrum clock is supplied again upon elapse of time. Since it is also required that this operation be changed over reversibly, there is a need for a smooth transition between absence and presence of the spread spectrum clock function. These functions are not incorporated in conventional spread spectrum clock generators and therefore a transient change in frequency occurs at the time of changeover and communication may be interrupted. A system set forth in Patent Document 3 cited above has a function for controlling a spread spectrum clock but a problem with this system is that the clock frequency fluctuates sharply owing to this control.

SUMMARY OF THE DISCLOSURE

A spread spectrum clock generating apparatus according to a first aspect of the present invention, comprises: a phase interpolator for receiving an input clock signal and a control signal, varying phase of an output clock signal in accordance with said control signal to output the resultant output clock signal; and a control circuit for receiving and counting the input clock signal, generating said control signal, which is for varying the phase of the output clock signal and frequency-modulating the input signal, based upon result of the count, and supplying the generated control signal to said phase interpolator. The control circuit, responsive to a frequency-modulation start signal which is input thereto at any timing, starts output of the control signal which is for performing the frequency modulation, at a timing at which the frequency of the output clock signal is equal to the frequency of the input clock signal, and responsive to a frequency-modulation stop signal which is input thereto at any timing, stops output of the control signal which is for performing the frequency modulation, at a timing at which the frequency of the output clock signal is equal to the frequency of the input clock signal.

In accordance with the present invention having such a structure, a smooth spread spectrum clock can be obtained from the phase interpolator. Further, the arrangement is such that a changeover between absence and presence of frequency modulation is performed at a timing at which the frequency of the input clock signal coincides with that of the output clock signal.

The meritorious effects of the present invention are summarized as follows.

In accordance with the present invention, as described above, a spread spectrum clock generator can be realized using a phase interpolator and a control circuit (a controller), without relying upon a pulse-swallow frequency divider and a VCO, etc.

Further, in accordance with the present invention, a step phase error in the clock output prevailing when an up signal or down signal is input to the phase interpolator is decided by the resolution of the phase interpolator. As a result, a smooth spread spectrum clock can be generated.

Furthermore, in accordance with the present invention, the arrangement is such that the control circuit is caused to operate by a frequency-divided clock obtained by frequency-dividing the input clock. As a result, it is possible to apply frequency modulation to clocks of higher frequencies.

Furthermore, in accordance with the present invention, it is possible to achieve a smooth transition between absence and presence of a spread spectrum clock function.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Preferred embodiments of the present invention will be described in detail with reference to the drawings. The principle of a referential example of the invention will be described first, followed by a description of the preferred embodiments.

Figure 1:
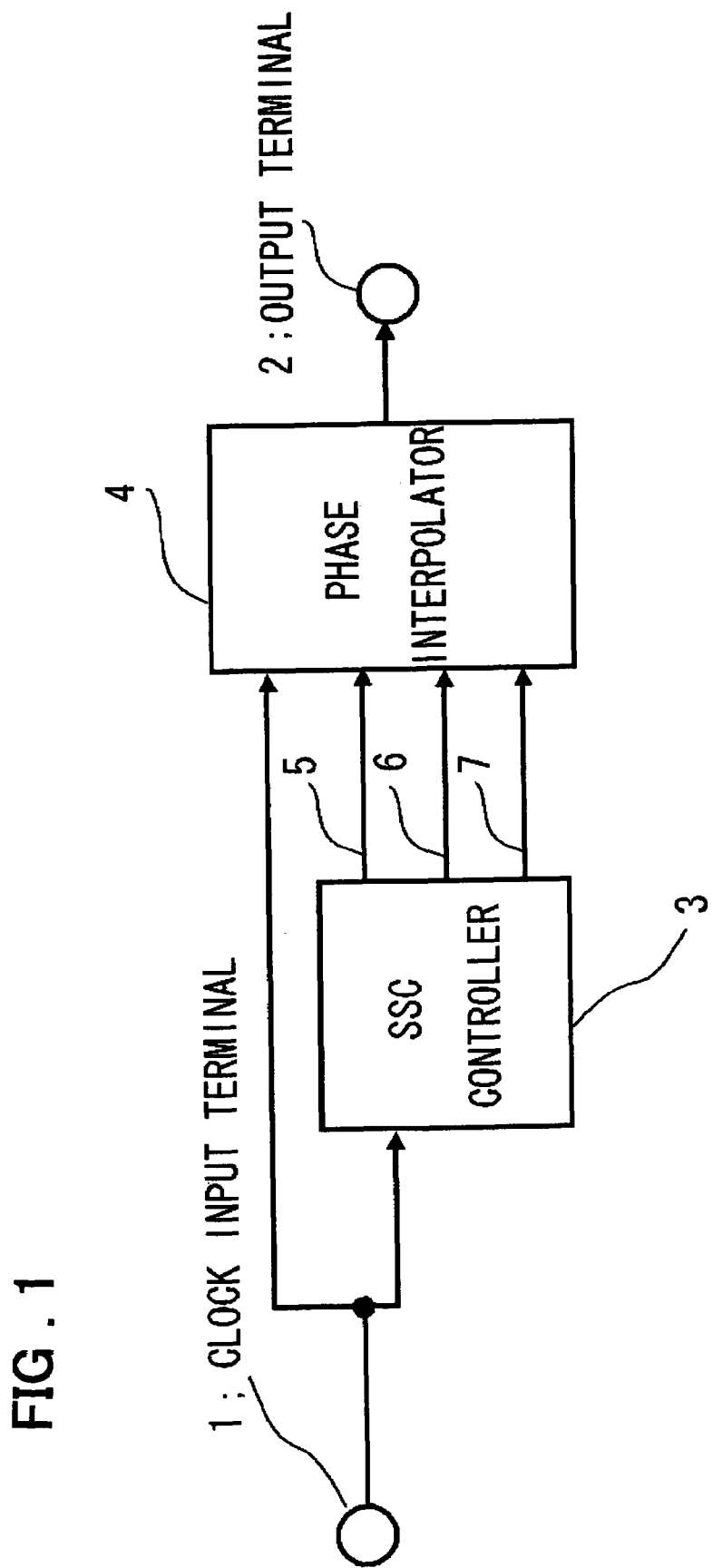
FIG. 1 is a block diagram illustrating the configuration of a first referential example of the present invention.

FIG. 1 is a block diagram illustrating the configuration of a first referential example of the present invention. As illustrated in FIG. 1, the referential example includes a phase interpolator 4 and a controller 3 (referred to also as an "SSC controller"). A clock signal that enters from an input terminal 1 is input to both the controller 3 and phase interpolator 4.

The controller 3 outputs a timing signal 5 that is generated based upon the input clock signal. Further, the controller 3 counts the input clock signal and, on the basis of the count, performs control to output an up signal 6, which instructs the phase interpolator 4 to advance the phase of the output clock signal thereof a prescribed amount, and/or a down signal 7, which instructs the phase interpolator 4 to retard the phase of the output clock signal thereof a prescribed amount. More specifically, on the basis of the result of counting the input clock signal, the controller 3 performs control to output the up signal 6/down signal 7 a prescribed number of times at every interval that is a prescribed multiple of one period of the input clock signal. The configuration and operation of the controller 3 will be described in detail later.

The phase interpolator 4 advances or retards the phase of the output clock signal based upon the polarity of the up signal 6 or down signal 7 from the controller 3 at a prescribed timing decided by the timing signal 5 (the timing of the rising or falling edge of the timing signal 5). In the example of FIG. 1, a single-phase clock signal is input to the phase interpolator 4 in order to simplify the description of the invention. However, the clock is not limited to a single-phase clock and it is permissible to use a 2-phase clock or multiphase clock such as a 4- or 8-phase clock as a matter of course.

In this referential example, the increments in which the phase of the output clock signal from the phase interpolator 4 is advanced or retarded are decided by the resolution of the phase interpolator 4. In the description that follows, it will be assumed that the resolution of the phase interpolator 4 is $T_0/N$, where $T_0$ represents one period of the clock signal input to the clock input terminal 1, and N represents a predetermined positive integer.

The phase interpolator 4 delays the phase of the output clock signal a prescribed amount at the rising edge of the timing signal 5 from the controller 3 when the down signal 7 is at logic "1". At this time the amount of phase retarded by the phase interpolator 4 is assumed to be, e.g., the unit resolution $T_0/N$, as a result of which the period of the output clock signal becomes $T_0+(1/N)\times T_0$.

Further, the phase interpolator 4 advances the phase of the output clock signal a prescribed amount at the rising edge of the timing signal 5 from the controller 3 when the up signal 6 is at logic "1". At this time the amount of phase advanced by the phase interpolator 4 is assumed to be, e.g., the unit resolution $T_0/N$, as a result of which the period of the output clock signal becomes $T_0-(1/N)\times T_0$.

In accordance with this referential example, the period of the output clock of the phase interpolator 4 is thus varied by the up signal 6 and down signal 7 from the controller 3. That is, the frequency of the output clock signal is modulated and a spread spectrum clock is generated. A specific example of generation of a spread spectrum clock will be described in detail.

Let $f_0$ represent the frequency of the clock signal that enters from the clock input terminal 1, and let $T_0$ represent one period. The frequency $f_0$ and period $T_0$ are related as indicated by the following equation:

$$f_0 = 1/T_0 \qquad (1)$$

Let k (where k is a predetermined positive integer) represent a reference number of periods of a clock (e.g., number of cycles of the input clock signal or clock obtained by frequency-dividing the same). Let n represent the difference between the number of down signals 7, which retard the phase of the output clock signal, and the number of up signals 6, which advance the phase of the output clock signal, in a period of time equivalent to $k\times T_0$ [i.e., the difference between the number of times down signal 7 is logical 1 (in the activated state) and the number of times the up signal 6 is at logic "1" (in the activated state)]. The difference is represented by Equation (2) below.

$$n = \text{(number of down signals)} - \text{(number of up signals)} \qquad (2)$$

If we let $T_{<average>}$ represent the average period of the output clock signal in the number k of periods serving as the reference when the difference between the number of down signals 7 and number of up signals 6 in the reference number k of periods is n, then the following equation will hold:

$$k \times T_{<average>} = k \times T_0 + (n/N) \times T_0$$

In view of the fact that average frequency $f_{<average>}$ in the number k of periods is equal to $1/T_{<average>}$, $f_{<average>}$ is given by Equation (3) below.

$$f_{<average>} = k/[k \times T_0 + (n/N) \times T_0] = (1/T_0) \times (k \times N)/(k \times N + n) \qquad (3)$$

where the value of n satisfies the relation $-k \leq n \leq k$.

The following holds in accordance with Equation (3) above:

$f_{<average>}$ is smaller than $f_0 (=1/T_0)$ if n is a positive value;

$f_{<average>}$ is greater than $f_0$ if n is a negative value; and $f_{<average>} = f_0$ if n is zero.

The controller 3 controls n. That is, on the basis of the input clock signal, the controller 3 performs control to increase or decrease n (the difference between the number of down signals 7 and up signals 6 in the number k of periods serving as the reference) within the range $-k \leq n \leq k$ with the passage of time.

If we let n(t) represent the number of n's (differences between the number of down signals 7 and up signals 6) in a past reference number k of periods at time t, then n(t) will be the average number of n's in the reference number k of periods. If we let f(t) represent the average frequency at time t, then f(t) can be expressed by Equation (4) below.

$$f(t) = (1/T_0) \times (k \times N)/[k \times N + n(t)] \qquad (4)$$

Equation (4) above indicates that f(t) has been frequency-modulated. Described below is an example in which n(t) is increased or decreased every reference number k of periods and makes a round trip over $-k \leq n(t) \leq k$, where we assume that the frequency $(1/T_0)$ is 100 MHz, that the resolution N of the phase interpolator 4 is 64 and that the reference number k of periods is 100.

From Equation (4) above, frequency modulation is a minimum of 98.46 MHz and a maximum of 101.59 MHz.

As an example of control of n(t) in controller 3, n(t) is decremented by, e.g., one from an initial value of, e.g., zero every reference number k of periods, and at a time $k \times k \times T_0$ (100 µs), n(t)=−k is attained and f(t) attains the maximum value of 101.59 MHz. Then, n(t) is incremented from this value by, e.g., one every reference number k of periods, and at a time $3 \times k \times k \times T_0$ (300 µs), n(t)=+k is attained and f(t) attains the minimum value of 98.46 MHz. Then, n(t) is decremented from this value by, e.g., one every reference number k of periods, and at a time $4 \times k \times k \times T_0$ (400 µs), n(t)=0 is attained. The above-described sequence constitutes a single period Tfm of frequency modulation and the sequence is repeated every period Tfm.

Accordingly, one period Tfm of frequency modulation is found from Equation (5) below.

$$Tmf = 4 \times k \times k \times T_0 \qquad (5)$$

In accordance with Equation (5) above, the period Tfm is 400 μs and the output clock signal from output terminal 2 is a spread spectrum clock that has been frequency-modulated at 2.5 kHz.

Figure 2:
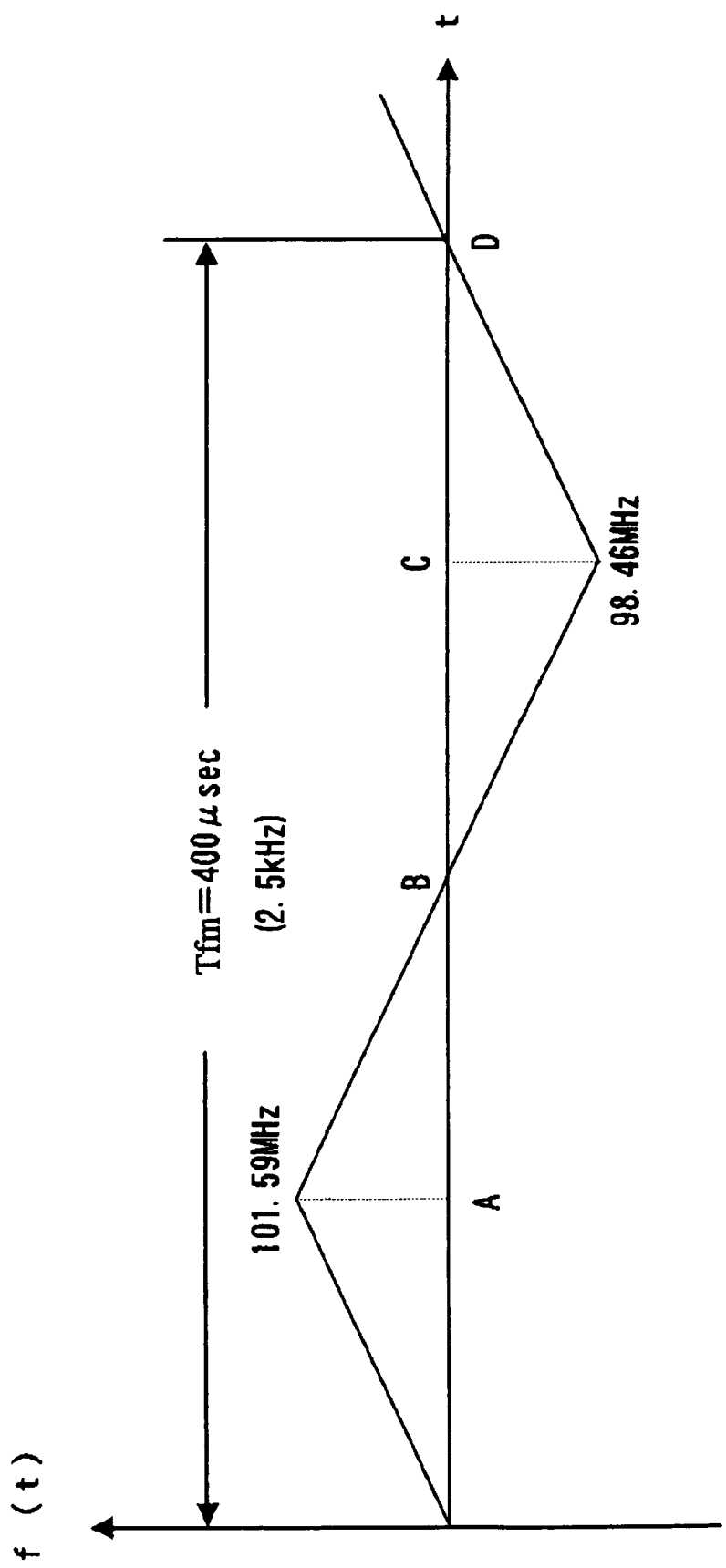
FIG. 2 is a diagram illustrating an example of frequency modulation in a time domain in the first referential example.

FIG. 2 is a diagram illustrating the results of frequency modulation along the time axis in this referential example. Time is plotted along the horizontal axis and average frequency f(t) along the vertical axis. It will be understood also from FIG. 2 that the signal has been frequency-modulated at 2.5 kHz (period Tfm=400 μs). In FIG. 2, points in time A, B, C and D are 100 μs (=k×k×$T_0$), 200 μs (=2×k×k×$T_0$), 300 μs (=3×k×k×$T_0$) and 400 μs (=4×k×k×$T_0$). The average frequencies per reference number k of periods at these times are 101.59 MHz, 100 MHz, 98.46 MHz and 100 MHz, respectively.

In this referential example, the timing signal 5 and input clock signal are described as being of the same frequency. When the clock frequency rises, the operating frequency of the controller 3 also rises. It is therefore necessary to provide a pre-frequency divider (not shown in FIG. 1, but refer to a pre-frequency divider 21 in FIG. 3, described later) at the clock input of the controller to thereby suppress the operating frequency. If the frequency dividing ratio of the pre-frequency divider is m, then the timing signal 5, up signal 6 and down signal 7 will each be frequency-divided thereby to enable the operating frequency to be reduced.

In the arrangement having the pre-frequency divider, Equations (4) and (5) above can be obtained by substituting m×$T_0$ for $T_0$ into these equations. If the pre-frequency dividing ratio m is 4 and $f_0$ is 400 MHz, then the degree of modulation will be the same and a spread spectrum clock having a modulation frequency of 400 MHz can be achieved.

Figure 3:
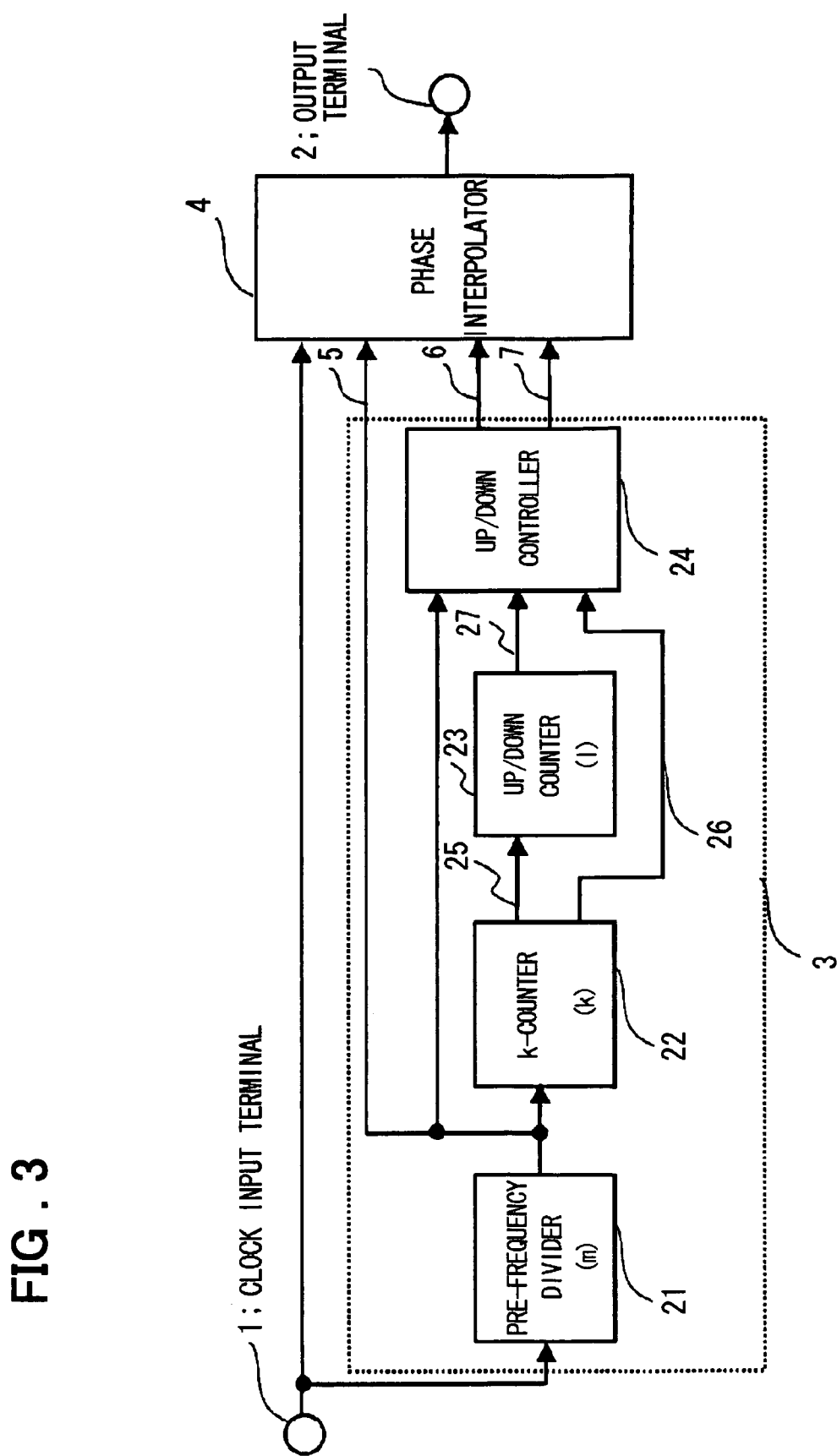
FIG. 3 is a block diagram illustrating the configuration of a second referential example of the present invention.

A second referential example of the present invention will be described next. FIG. 3 is a block diagram illustrating the configuration of a second referential example of the present invention. One example of the configuration of the controller of FIG. 1 is illustrated in FIG. 3, in which components identical with or equivalent to those shown in FIG. 1 are designated by like reference characters. The configuration and operation of the controller 3 will be described below.

As shown in FIG. 3, the controller 3 includes a pre-frequency divider 21, a k-counter 22, an up/down counter 23 and an up/down controller 24. Each of these components will now be described.

The input clock signal from the clock input terminal 1 is supplied to the pre-frequency divider 21, which proceeds to frequency-divide the input clock signal in accordance with the dividing ratio m and output the frequency-divided clock as the timing signal 5. The timing signal 5 output from the pre-frequency divider 21 is supplied to the k-counter 22, which is for counting the number k of periods serving as the reference, and to the phase interpolator 4 and up/down controller 24.

The k-counter 22 outputs a k-count output signal 25 whenever k-number of the timing signals 5 are counted. Here k corresponds to the reference number k of periods mentioned above. In this referential example, the reference number k of periods corresponds to k cycles of the timing signal 5, which is the frequency-divided clock signal. The k-count output signal 25 from the k-counter 22 is supplied to the up/down counter 23. When the k-counter 22 outputs the k-count output signal 25, the value of the count in the counter is cleared to zero and the counter again starts counting the timing signal 5. A k-count output signal 26 is supplied to the up/down controller 24.

The up/down counter 23 receives the k-count output signal 25 and counts this signal up and down repeatedly. That is, the up/down counter 23 performs the following operation repeatedly: The counter 23 receives the k-count output signal 25 and counts up from the initial value (e.g., zero) of the counter successively. If the count reaches a prescribed value 1, then the counter 23 counts down from the input of the next k-count output signal 25 successively in the manner 1–1, 1–2, . . . . If the count reaches –1, then the counter counts up from the next input of the k-count output signal 25 in the manner –1+1, –1+2, . . . , 0, 1, 2 until the prescribed value 1 is attained. A count value 27 from the up/down counter 23 is input to the up/down controller 24.

The up/down controller 24 outputs the up signal 6 or down signal 7 to the phase interpolator 4 in sync with the timing signal 5 from the pre-frequency divider 21 based upon a combination of the k-count output signal 26 and count value 27 input thereto.

On the basis of the up signal 6 or down signal 7 from the controller 3, the phase interpolator 4 delivers the output clock signal, which is the result of frequency modulating the input clock signal, as the spread spectrum clock signal.

In FIG. 3, the pre-frequency divider 21 converts the operating period of the controller 3 from the period $T_0$ of the input clock signal to m×$T_0$. The k-counter 22, which receives the timing signal 5 that is the frequency-divided clock signal from the pre-frequency divider 21, counts the reference number k of periods. Further, the up/down counter 23 performs the up-count or down-count operation based upon the k-count output signal 25, which is output from the k-counter 22, every cycle k×m×$T_0$.

In this referential example, it is assumed that the number of counts of the up/down counter 23 is 1. This differs from the value in regard to the up/down counter 23 in the first referential example. In the first referential example, which has been described with reference to FIGS. 1 and 2, the number of counts of the up/down counter 23 is assumed to be k (i.e., a value identical with the number k of periods serving as the reference).

In this referential example, the degree of frequency modulation of the output clock signal is obtained by replacing the range of fluctuation of n(t) in Equation (4) with –1≦n(t)≦1.

A modulation period Tfm2 of frequency in this referential example is found from Equation (6) below.

$$Tfm2 = 4 \times k \times l \times m \times T_0 \qquad (6)$$

where k represents the number of periods, m the frequency dividing ratio, l the number of counts of the up/down counter 23 and $T_0$ one period of the input clock.

In this referential example, the controller 3 controls the value of the up signal 6 or down signal 7, which is supplied to the phase interpolator 4, and therefore controls n(t) in a manner similar to that of the foregoing referential example. The controller performs sequence control in units of the period Tfm2. An example of this sequence control is as follows: First, n(t) is decremented from n(t)=0 by, e.g., one every reference number m×k of periods, and at a time k×l×m×$T_0$, n(t)=–1 is attained [f(t)=101.59 MHz]. Then, n(t) is incremented by, e.g., one every reference number m×k of periods and at a time 3×k×l×m×$T_0$, n(t)=+1 is attained [f(t)=98.46 MHz]. Then, n(t) is decremented by, e.g., one every reference number m×k of periods and at a time 4×k×l×m×$T_0$, n(t)=0 is attained. In the controller 3 of this referential example, the transition of frequency modulation over time agrees with that of the example shown in FIG. 2 in a case where l=k, m=1 holds.

In accordance with this referential example, the degree of frequency modulation and the period of modulation can be set optimally by changing the count values of k and l appropriately.

Thus, in accordance with this referential example as described above, a spread spectrum clock generating apparatus is implemented using the phase interpolator 4, which has a resolution of N, and the controller 3. Since the step phase error of the output clock signal when the up signal 6 or down signal 7 is supplied to the phase interpolator 4 is decided by $T_0/N$, it is possible to generate a smooth spread spectrum clock signal. Further, since a clock obtained by frequency dividing the input clock is used in the controller 3, the operating frequency of the controller 3 can be suppressed and it is possible to support a high-speed clock.

A third referential example of the present invention will be described next. In the first and second referential examples, frequency modulation is implemented by a combination of the up signal 6 and down signal 7 supplied to the phase interpolator 4. In the third referential example, however, frequency modulation is achieved using only the down signal 7. First an overview of an apparatus to which the third referential example of the invention is applied will be given, then the configuration of the third referential example and the frequency modulating operation thereof will be described.

Operating frequencies have risen in recent years and bit-to-bit skew specifications in parallel interface buses have become more stringent. If a large number of buses are connected in cascade, bit-to-bit skew of the buses falls out of specs and begins to impede communication. For example, with an IDE interface (also referred to as an "ATA interface") that connects a hard disk and a CPU, parallel interfaces up to ATA 100 have been used. Furthermore, though a high-speed ATA 133 also has been studied, the development of serial interfaces in which bit skew fundamentally does not occur has become the focus of attention. SATA (Serial ATA) is a first-generation serial-interface standard in which the communication speed is 1.5 Gbps. In order to exclude continuous high or low levels, communication speed becomes 120 MBbs owing to use of an 8B10B converting circuit. This speed is higher than the 100 MBps of the ATA 100. Further, a plan to double communication speed every two years has been announced as a development roadmap. This is seen as being an interface standard that will readily allow high communication speeds to be achieved in the future. Since SATA is an interface used in personal computers or servers employed widely in homes and offices, EMI countermeasures are incorporated in the specifications.

The specifications referred to as "Downspread" aim to reduce the power peak of clock frequency by about 7 dB by applying frequency modulation of −5000 ppm to the clock center frequency from a modulation frequency of 30 kHz to 33 kHz.

Figure 4:
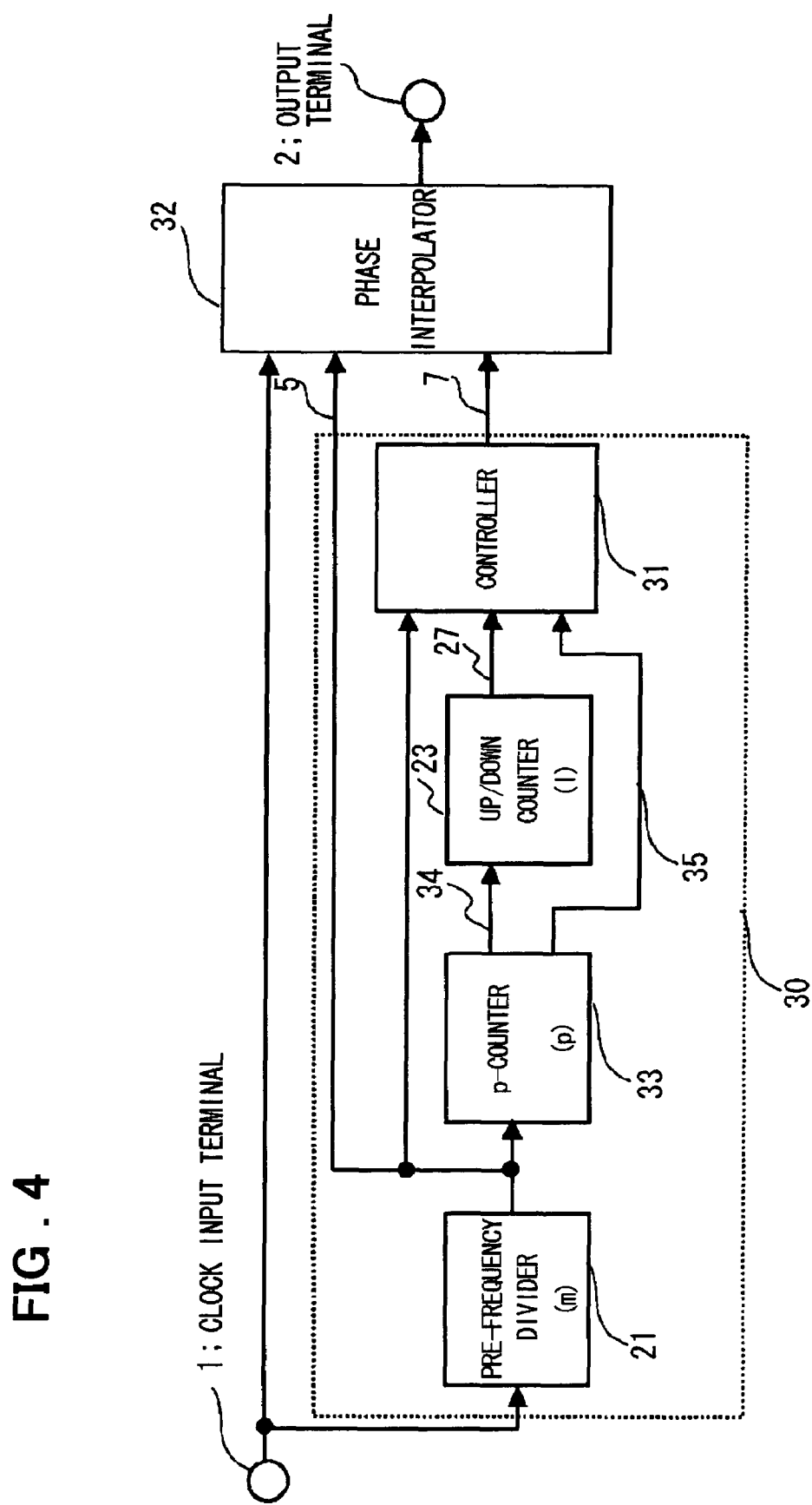
FIG. 4 is a block diagram illustrating the configuration of a third referential example of the present invention.

The clock generating apparatus of the third referential example of the present invention is ideal for application to a system in which spectrum spreading is in the down direction. FIG. 4 is a block diagram illustrating the configuration of the third referential example, in which components identical with or equivalent to those shown in FIG. 3 are designated by like reference characters. As shown in FIG. 4, a controller 30 and a phase interpolator 32 differ from the controller and interpolator of the second referential example shown in FIG. 3. Primarily, these differences from the second referential example will be described below.

As shown in FIG. 4, in this referential example the controller 30 outputs only the down signal 7 as the output signal to the phase interpolator 32.

In this referential example, a number p of periods serving as a reference is defined in conformity with a number of clock periods serving as the unit of frequency up/down control. In the first and second referential examples, on the other hand, the number k of periods serving as the reference is made to conform to half the number of clock periods serving as the unit of frequency up/down control. Further, in this referential example, n [see Equation (2) above] is assumed to satisfy the relation $0 \leq n \leq 2 \times l$ in an interval $(m \times p \times T_0)$ decided by the reference number p of periods, where n is the difference between the down signal 7 output from the controller 30 to the phase interpolator 32 and an up signal (where the number of times the up signal is output is zero). By contrast, n is set to $-k \leq n \leq k$ in the first referential example and to $-l \leq n \leq l$ in the second referential example.

In this referential example, the phase interpolator 32 receives the down signal 7 that is output from the controller 30 and delivers the output clock signal whose phase has been adjusted in accordance with the down signal 7.

The basic configuration and operation of the controller 30 in this referential example are substantially similar to those of the controller 3 of the second referential example, though the controller 30 is adapted so as to output the down signal 7 only. The controller 30 includes the pre-frequency divider 21, a p-counter 33 for counting the timing signal 5 from the pre-frequency divider 21, the up/down counter 23 and a controller 31. The timing signal 5 from the pre-frequency divider 21 (frequency dividing ratio=m), the count value 27 from the up/down counter 23 and a count value 35 from the p-counter 33 are supplied to the controller 31, which outputs the down signal 7 at a timing decided by the timing signal 5.

When the maximum number of up signals 6 is output [n(t)=−1] in the second referential example illustrated in FIG. 3, no up signal is output in this referential example.

Further, when the up signal 6 and down signal 7 do not appear [n(t)=0] in the second referential example illustrated in FIG. 3, one down signal 7 from the controller 31 is output in the reference number m×p of periods in this referential example.

This referential example is such that when the maximum number of down signals 7 is output (time E in FIG. 5), the number of down signals 7 that is output from the controller 31 in the reference number m×p of periods is 2×l.

This referential example will now be described taking specific design values as an example.

Here m=4 is adopted as the frequency dividing ratio of the pre-frequency divider 21. The larger the frequency dividing ratio m, the more the operating speed of the p-counter 33, up/down counter 23 and controller 31 can be reduced. If the frequency dividing ratio m is made too large, however, phase modulation will become too coarse. The frequency modulation degree and the frequency dividing ratio m can be expressed by Equation (7) below. It should be noted that Equation (7) holds on the assumption that the down signal 7 continues to be output at the time of maximum frequency modulation.

$$\text{degree of frequency modulation} = 1(m \times N) \qquad (7)$$

If the phase interpolator 32 used has a resolution N of 64, then the frequency dividing ratio m and degree of frequency modulation will be as indicated in Table 1 below.

TABLE 1

| FREQUENCY DIVIDING RATIO (m) | DEGREE OF FREQUENCY MODULATION |
|---|---|
| 3 | 0.0052 |
| 4 | 0.0039 |
| 5 | 0.00313 |

The frequency dividing ratio m of the pre-frequency divider 21, the reference number p of periods, the count 1 of the projection region WE and the modulation frequency are related by the inequality of Expression (8) below, in which 0.033 and 0.03 represent the modulation frequencies 33 kHz and 30 kHz, respectively, in units of MHz, and 1500 represents 1.5 GHz in units of MHz.

$$1500/0.033 \leq 2 \times m \times p \times 1 \leq 1500/0.03 \quad (8)$$

Expression (8) will now be described. If we assume that one clock period is $T_0[=1/(1500\times10^6)]$, then the modulation period Tfm3 of this referential example will be given by Equation (9) below.

$$Tfm3 = 2 \times m \times p \times 1 \times T_0 \quad (9)$$

Accordingly, Expression (8) is derived from the requirement that one modulation period Tfm3 is equal to or greater than $1/(33\times10^3)$ and equal to or less than $1/(30\times10^3)$.

In this referential example, the controller 31 controls the value of the down signal 7 supplied to the phase interpolator 32 and therefore controls n(t). The controller performs sequence control in units of the period Tfm3. An example of this sequence control is as follows: First, n(t) is incremented from n(t)=0 (e.g., see time F in FIG. 5) successively every reference number m×p of periods, and at a time m×p×1×T$_0$ (e.g., see time E in FIG. 5), n(t)=2×1 is attained. Then, n(t) is decremented successively every reference number m×p of periods and at a time 2×m×p×1×T$_0$ (e.g., see time G in FIG. 5), n(t)=0 is attained.

If we solve Expression (8), assuming that p=1 holds for the sake of simplicity, then, with m=4, we have $$75.38 \leq p=1 \leq 79.05 \quad (10)$$

If we adopt p=1=77 from among the p and 1 that satisfy the inequality (10), then the modulation frequency will be 31.62 kHz.

Figure 5:
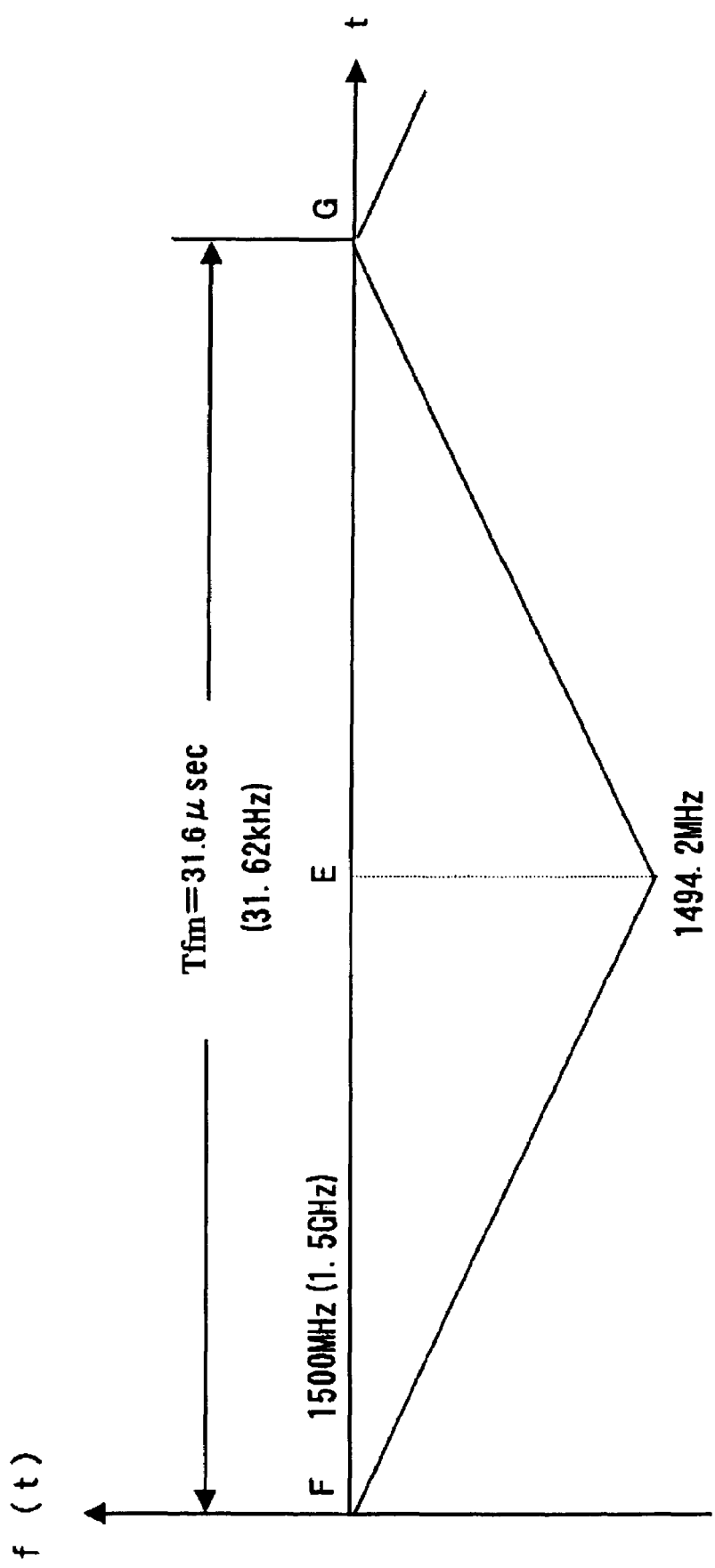
FIG. 5 is a diagram illustrating an example of frequency modulation in a time domain in the third referential example.

FIG. 5 is a diagram illustrating an example of frequency modulation in a time domain in a case where m=4, p=1=77 hold according to this referential example. As shown in FIG. 5, the waveform (a triangular wave) in which the maximum modulation frequency has been set to 1.5 GHz (=1/T$_0$) is obtained. The minimum modulation frequency (time E in FIG. 5) becomes 1494.2 MHz.

In a modification of the third referential example, the controller 31 of FIG. 4 may be adapted to output only the up signal, rather than the down signal 7, as the control signal that is output to the phase interpolator 32. In this modification, the pre-frequency divider 21, p-counter 33 and up/down counter 23 are similar to those shown in FIG. 4. The phase interpolator 32 receives the up signal output from the controller 31 and produces an output clock signal the phase of which has been adjusted in accordance with the up signal.

In certain applications, there are situations where a spread spectrum clock is and is not used. In these applications, there is the possibility that communication will be interrupted if the clock frequency fluctuates suddenly when a changeover is made from the spread spectrum clock to the standard clock and vice versa. In conventional systems, there is a function for controlling the spread spectrum clock but a problem is that the clock frequency fluctuates sharply owing to such control.

Figure 6:
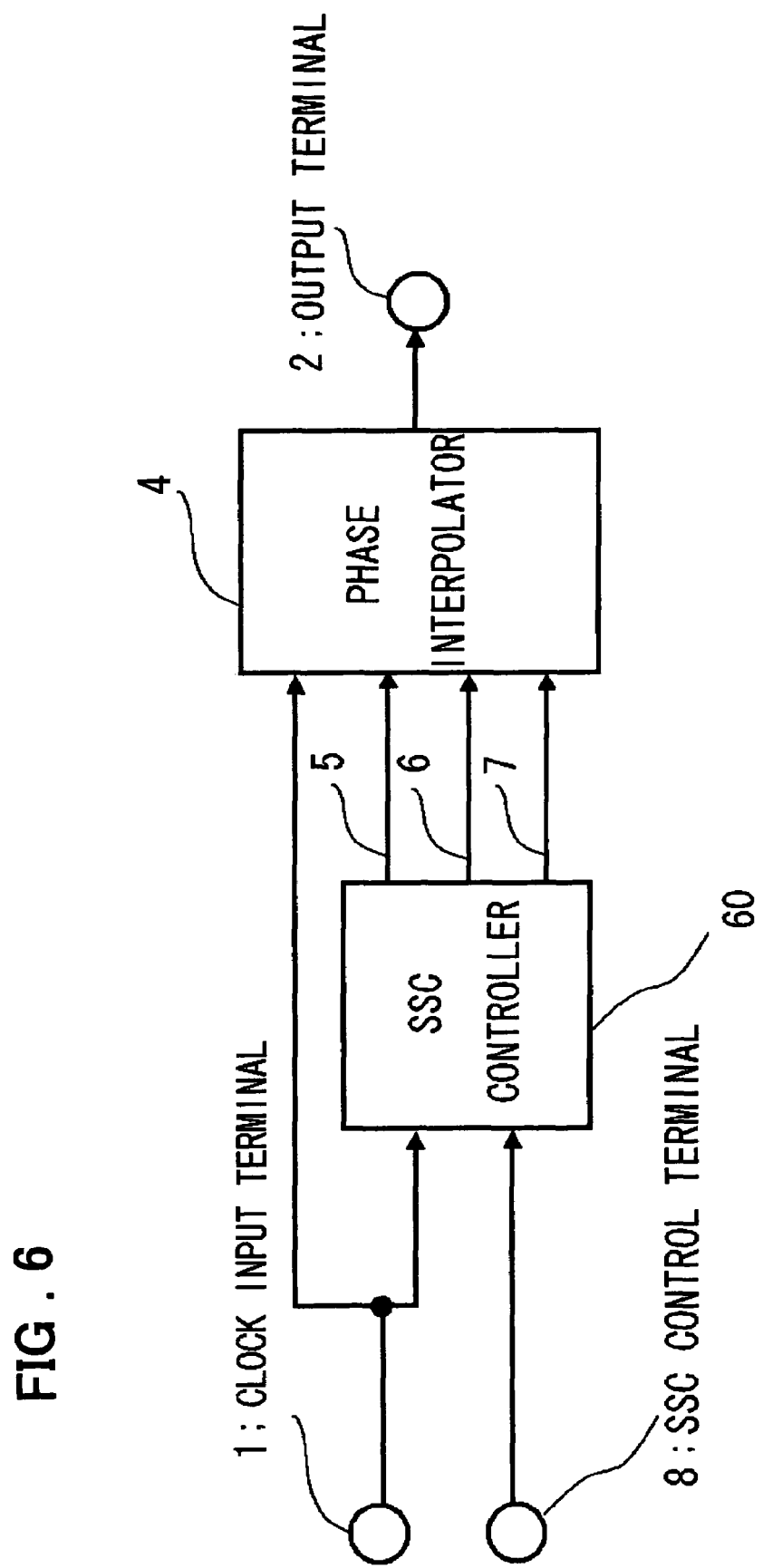
FIG. 6 is a block diagram illustrating the configuration of a first embodiment of the present invention.

FIG. 6 illustrates a first embodiment of the present invention. In FIG. 6, the system of the first referential example is provided with an SSC control terminal 8. By controlling this terminal, it is possible to avoid a sharp fluctuation in the clock frequency and smoothen the transition when a changeover is made from the spread spectrum clock signal to the standard clock signal and vice versa. Components in FIG. 6 identical with those in FIG. 1 are designated by like reference characters. In FIG. 6, the SSC control terminal 8 is connected to an SSC controller 60. The latter has a function for avoiding a sharp fluctuation in the clock frequency and to smoothen the transition when a changeover is made from the spread spectrum clock signal to the standard clock signal and vice versa in dependence upon the logic level at the SSC control terminal 8.

Figure 7:
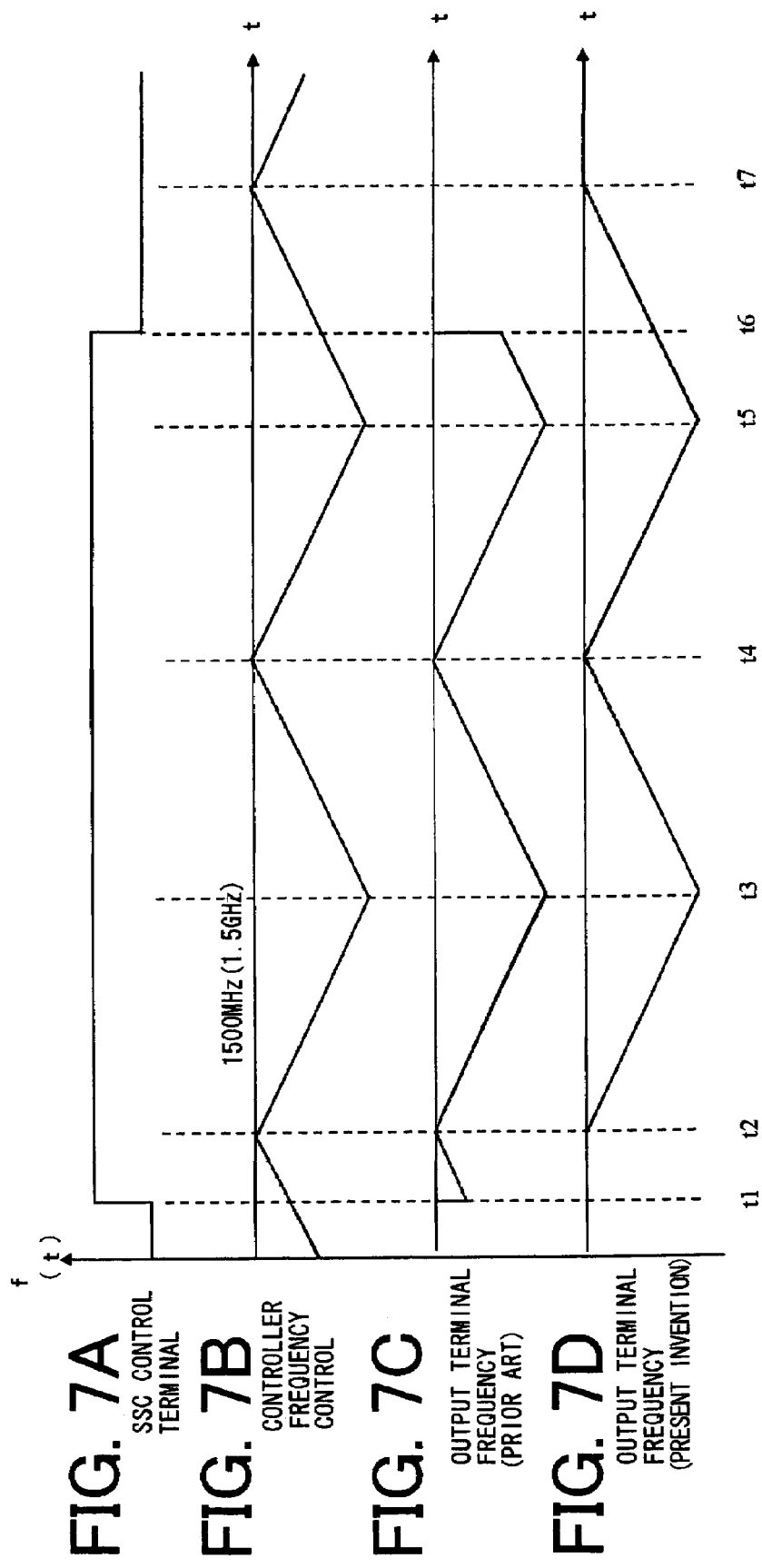
FIGS. 7A, 7B, 7C and 7D are a diagram illustrating an example of frequency modulation in a time domain in the first embodiment.

In FIG. 6, frequency control of the SSC controller 60 is controlled as shown in FIGS. 7A–7D by control of the SSC control terminal 8. FIG. 7A represents the control voltage of the SSC control terminal 8. The spread spectrum clock signal is output from the output terminal 2 when the control voltage of SSC control terminal 8 is at the high level, and the standard clock signal is output from the output terminal 2 when the control voltage of SSC control terminal 8 is at the low level. FIG. 7B represents the state of frequency control of SSC controller 60, and FIG. 7C represents the state in which the spread spectrum clock signal is output from the output terminal 2 when SSC control is performed in the conventional system. It will be understood from FIG. 7C that sudden fluctuations in output frequency occur at the state transition points at times t1 and t6 in the conventional system. FIG. 7D represents the state in which the spread spectrum clock signal is output from the output terminal 2 when control is performed by the SSC control terminal 8 according to the present invention. Although the control voltage of SSC control terminal 8 at time t1 undergoes a transition from the low to the high level, the spread spectrum clock signal continues to be output from the output terminal 2 at this time t1. The SSC controller 60 reaches the standard clock frequency at time t2. The SSC controller 60 changes over to the output mode for the spread spectrum clock signal at time t2. The system operates as a spread spectrum clock generator from time t2 onward. Although the control voltage of SSC control terminal 8 at time t6 undergoes a transition from the high to the low level, the spread spectrum clock signal continues to be output from the output terminal 2 at this time t6. The SSC controller 60 reaches the standard clock frequency at time t7. The SSC controller 60 changes over to the output mode for the standard clock signal at time t7. The standard clock signal is output from the output terminal 2 from time t7 onward.

Thus, a spread spectrum clock signal or standard clock signal that is free of any sudden fluctuation in clock frequency is output from the output terminal 2 owing to control of the SSC control terminal 8.

Figure 8:
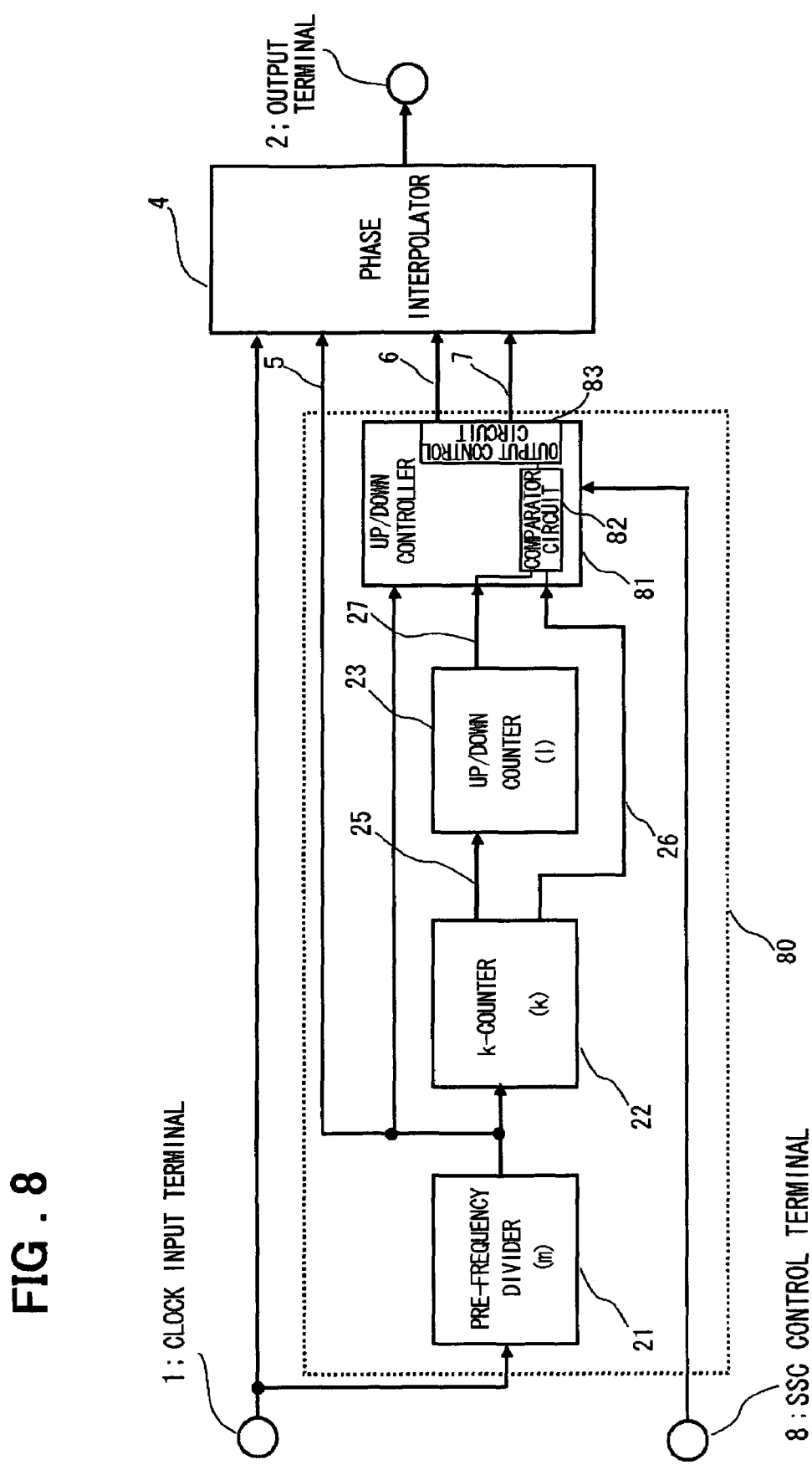
FIG. 8 is a block diagram illustrating the configuration of a second embodiment of the present invention.

A second embodiment of the present invention will now be described with reference to FIG. 8. The embodiment of FIG. 8 is obtained by adding the SSC control terminal 8 to the second referential example described above with reference to FIG. 3. FIG. 8 differs from FIG. 3 in the addition of the SSC control terminal 8 and in that an up/down controller 81 incorporates an output control circuit 83 that is controlled by the SSC control terminal 8.

The circuit according to the embodiment of FIG. 8 operates as follows when the logic level at the SSC control terminal 8 changes from the low to the high level. The k-count output signal 26 from the k-counter 22 and the count value 27 from the up/down counter 23 are supplied to a comparator circuit 82 incorporated within the up/down controller 81. When all bits of the k-count output signal 26 and count value 27 first fall to the low level after the SSC control terminal 8 changes from the low to the high level, it becomes possible for the up/down controller 81 to output the up signal 6 and the down signal 7. The timing at which all bits of the k-count output signal 26 and count value 27 fall to the low level indicates that frequency control of the up/down controller 81 has arrived at the standard frequency of the spread spectrum clock. The transition from the standard clock signal to the spread spectrum clock signal when the state of the SSC control terminal 8 changes from the low to the high level can be implemented smoothly by thus adding on the simple comparator circuit 82.

The circuit according to the embodiment of FIG. 8 operates as follows when the logic level at the SSC control terminal 8 changes from the high to the low level. The k-count output signal 26 from the k-counter 22 and the count value 27 from the up/down counter 23 are supplied to the comparator circuit 82 incorporated within the up/down controller 81. When all bits of the k-count output signal 26 and count value 27 first fall to the low level after the SSC control terminal 8 changes from the high to the low level, it becomes impossible for the up/down controller 81 to output the up signal 6 and the down signal 7. More specifically, the level is fixed at the low level. The timing at which all bits of the k-count output signal 26 and count value 27 fall to the low level indicates that frequency control of the up/down controller 81 has arrived at the standard frequency of the spread spectrum clock signal. The transition from the spread spectrum clock signal to the standard clock signal when the state of the SSC control terminal 8 changes from the high to the low level can be implemented smoothly by thus adding on the simple comparator circuit 82.

Figure 9:
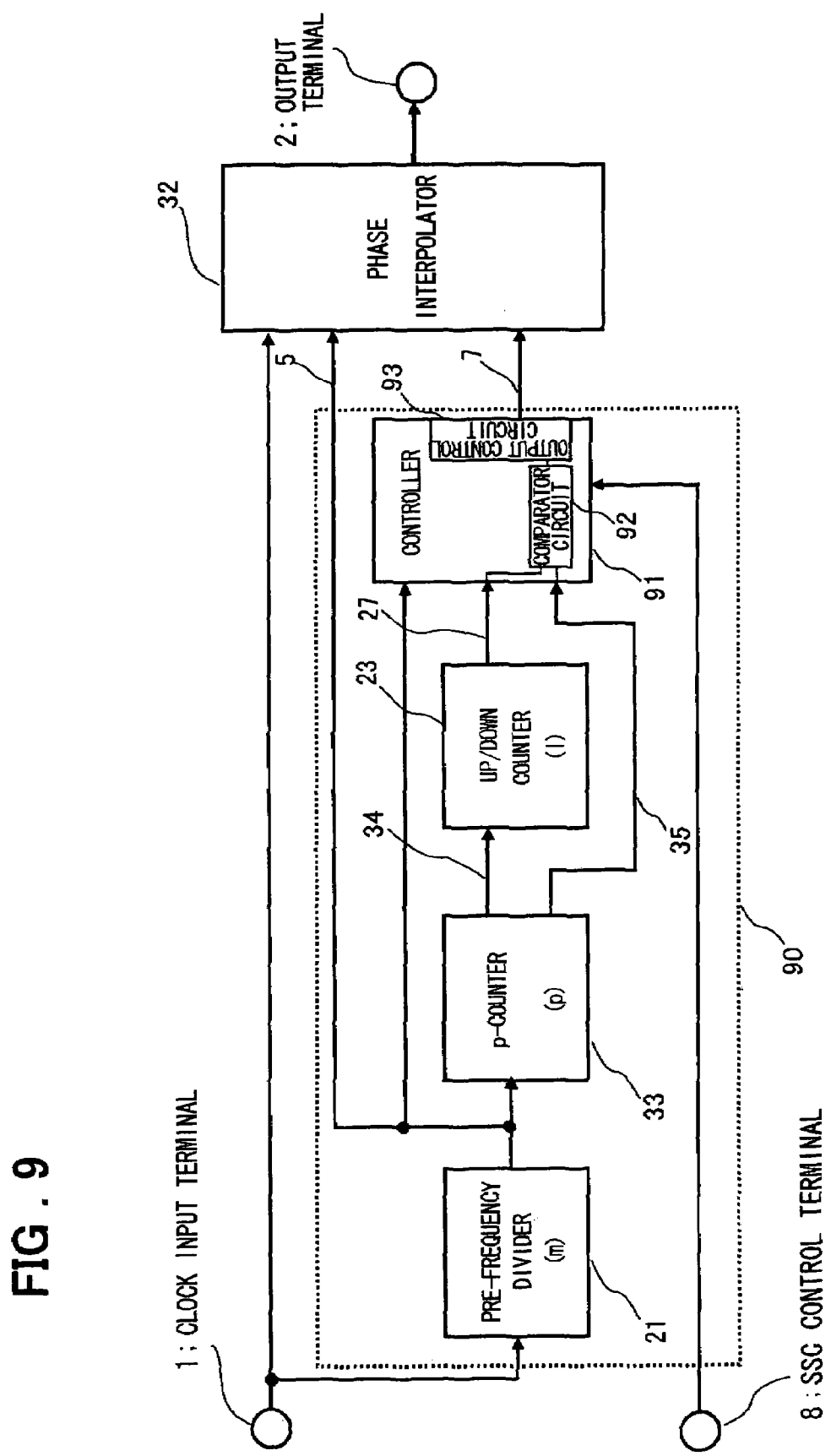
FIG. 9 is a block diagram illustrating the configuration of a third embodiment of the present invention.

A third embodiment of the present invention will now be described with reference to FIG. 9. The embodiment of FIG. 9 is obtained by adding the SSC control terminal 8 to the third referential example described above with reference to FIG. 4. Components in FIG. 9 identical with those in FIG. 4 are designated by like reference characters. FIG. 9 differs from FIG. 4 in the addition of the SSC control terminal 8 and in that a controller 91 incorporates an output control circuit 93 that is controlled by the SSC control terminal 8.

The circuit according to the embodiment of FIG. 9 operates as follows when the logic level at the SSC control terminal 8 changes from the low to the high level. The count value 35 from the p-counter 33 and the count value 27 from the up/down counter 23 are supplied to a comparator circuit 92 incorporated within the controller 91. When all bits of the count value 35 and count value 27 first fall to the low level after the SSC control terminal 8 changes from the low to the high level, it becomes possible for the controller 91 to output the down signal 7. The timing at which all bits of the count value 35 and count value 27 fall to the low level indicates that frequency control of the controller 91 has arrived at the standard frequency of the spread spectrum clock signal. The transition from the standard clock signal to the spread spectrum clock signal when the state of the SSC control terminal 8 changes from the low to the high level can be implemented smoothly by thus adding on the simple comparator circuit 92.

The circuit according to the embodiment of FIG. 9 operates as follows when the logic level at the SSC control terminal 8 changes from the high to the low level. The count value 35 from the p-counter 33 and the count value 27 from the up/down counter 23 are supplied to the comparator circuit 92 incorporated within the controller 91. When all bits of the count value 35 and count value 27 first fall to the low level after the SSC control terminal 8 changes from the high to the low level, it becomes impossible for the controller 91 to output the down signal 7. More specifically, the level is fixed at the low level. The timing at which all bits of the count value 35 and count value 27 fall to the low level indicates that frequency control of the controller 91 has arrived at the standard frequency of the spread spectrum clock signal. The transition from the spread spectrum clock signal to the standard clock signal when the state of the SSC control terminal 8 changes from the high to the low level can be implemented smoothly by thus adding on the simple comparator circuit 92.

In the second and third embodiments of the present invention, the counter values of the counters indicating the standard clock frequency are described as all being at the low level. However, the values are not limited to low values and the present invention can be implemented even if all of the signals are at the high level or at an intermediate level. Further, the third embodiment may be so adapted that only the up signal 6 is output rather than the down signal 7.

Figure 10:
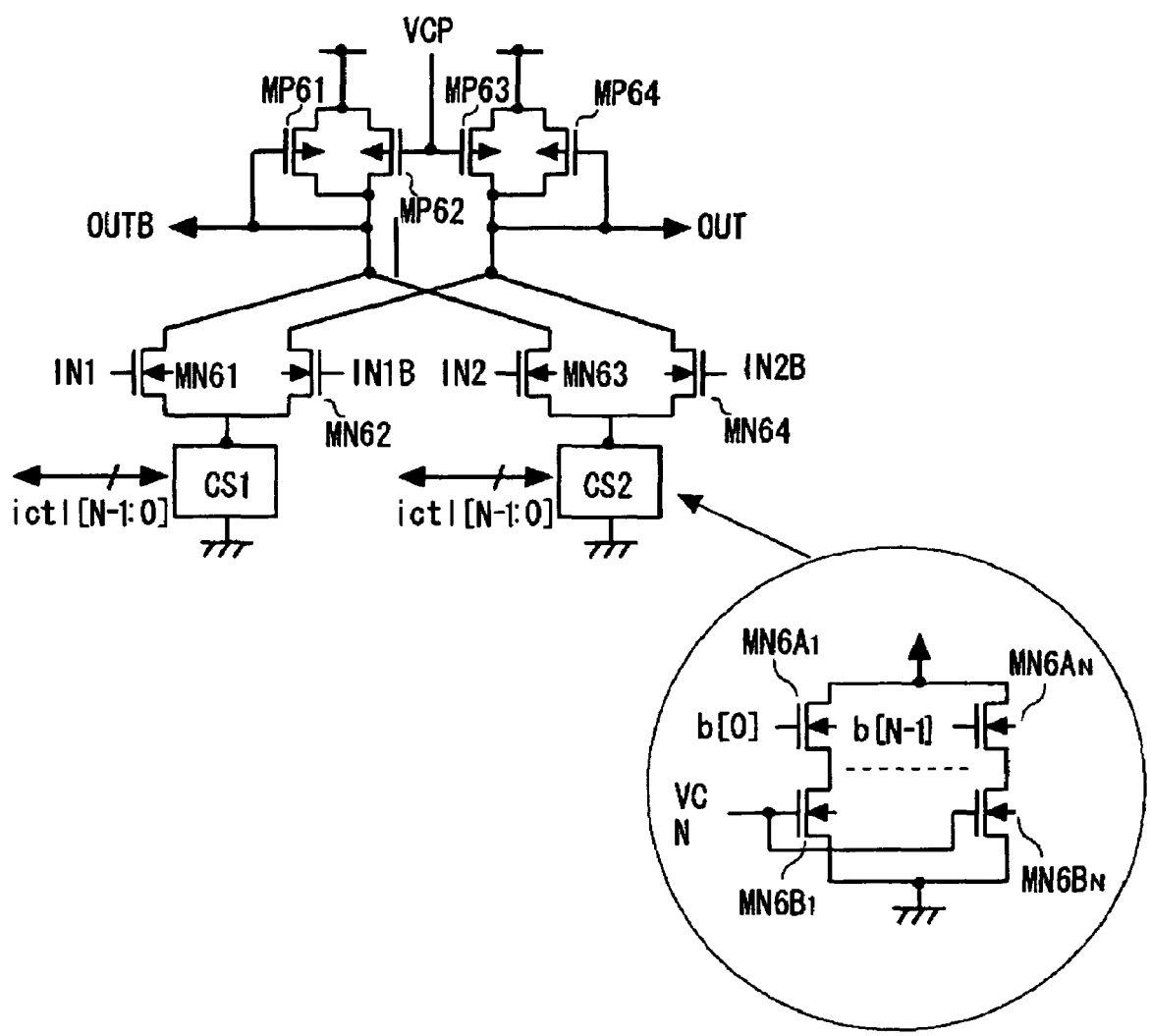
FIG. 10 is a diagram illustrating an example of a phase interpolator.

In the above embodiments, the phase interpolator 4 may employ any well-known circuitry. For example, a phase interpolator having a configuration illustrated in FIG. 10 may be used (see Non-patent Document 2 cited above). A 4-phase clock from the clock input terminal 1 of FIG. 6 may be supplied to inputs IN1, INB1 and IN2, IN2B in FIG. 10. As shown in FIG. 10, this phase interpolator includes NMOS transistors MN61 and MN62 and NMOS transistors MN63 and MN64. The NMOS transistors MN61 and MN62 constitute a first differential pair and have their sources tied together and connected to a first constant-current source CS1, receive respective ones of clocks IN1 and IN1B differentially at their gates and output respective ones of a pair of outputs thereof to one end of a first load (the common drain of parallel-connected PMOS transistors MP61 and MP62) and to one end of a second load (the common drain of parallel-connected PMOS transistors MP63 and MP64). The NMOS transistors MN63 and MN64 constitute a second differential pair and have their sources tied together and connected to a second constant-current source CS2, receive respective ones of clocks IN2 and IN2B differentially at their gates and have respective ones of a pair of outputs thereof connected to one end of the first load (the common drain of the PMOS transistors MP61 and MP62) and to one end of the second load (the common drain of the PMOS transistors MP63 and MP64). Outputs OUT and OUTB of phases that are a weighted sum of the two input clocks are delivered from a commonly connected output pair of the first and second differential pairs. This phase interpolator is such that digital weighting codes ict1 (namely N-number of bits b[0] to b[N−1] for supporting a phase resolution N, although it should be noted that 16 bits b[0] to b[15] are adopted in Non-patent Document 2 mentioned above) are supplied to the first and second constant-current sources CS1 and CS2. The current values of the first and second constant-current sources CS1 and CS2 can be varied (the number of constant-current sources MN6B$_1$ to MN6B$_N$ is selected by turning ON and OFF NMOS transistors MN6A$_1$ to MN6A$_N$ having N-number of bits b[0] to b[N−1] supplied to the gate terminals thereof) so that a conversion is made to the phase of the output clock. In FIG. 10, it is assumed that the current values of the constant-current sources MN6B$_1$ to MN6B$_N$ are the same. The phase interpolator 4 is adapted so as to generate and output the digital weighting code ict1 (thermometer code) from the difference n (a binary value) between the number of down signals 7 and number of up signals 6, which were output from the controller 3 during the past number k of periods serving as the reference, at a timing decided by the timing signal 5.

In FIG. 10, the active loads MP61, MP62 and MP63, MP64 may be replaced by resistors, respectively.

Figure 11:
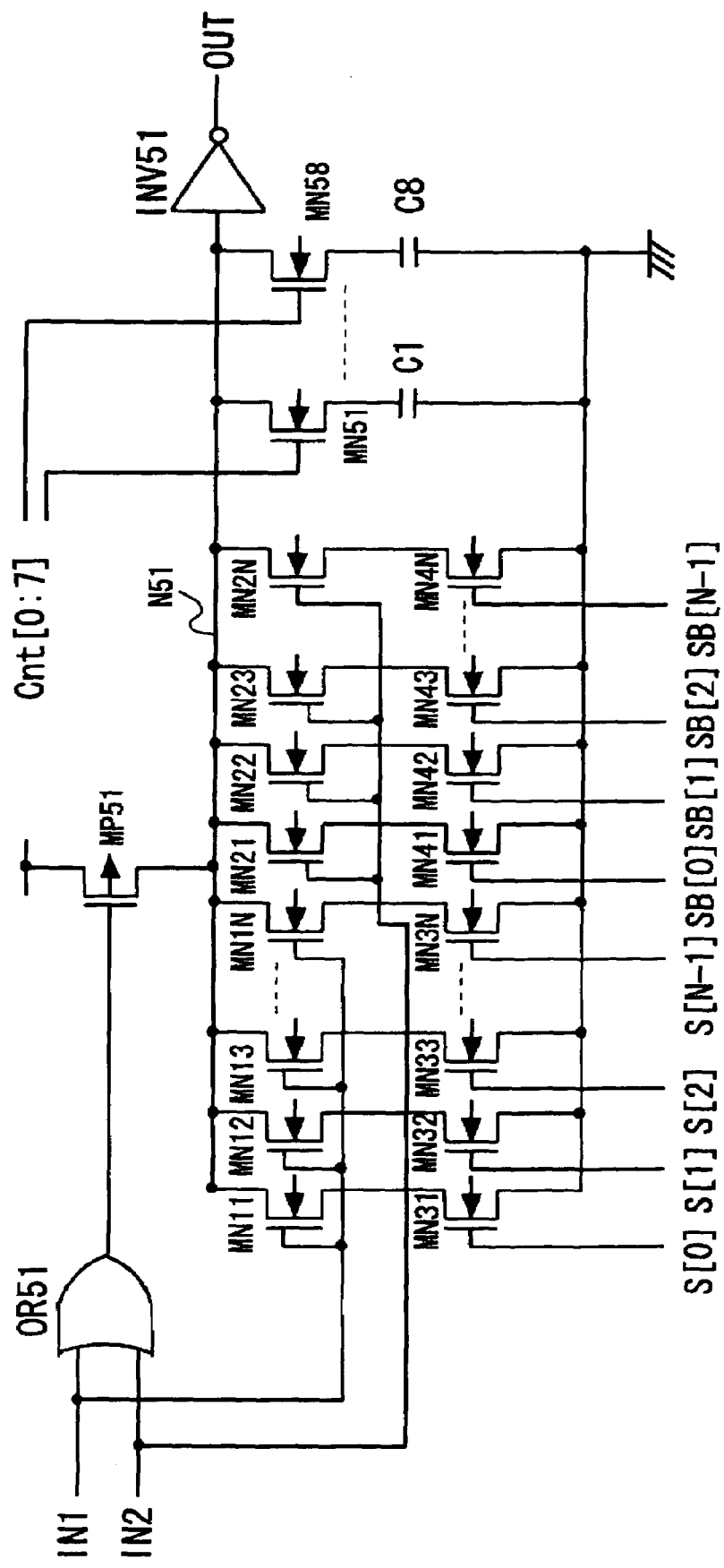
FIG. 11 is a diagram illustrating another example of a phase interpolator.
Figure 12:
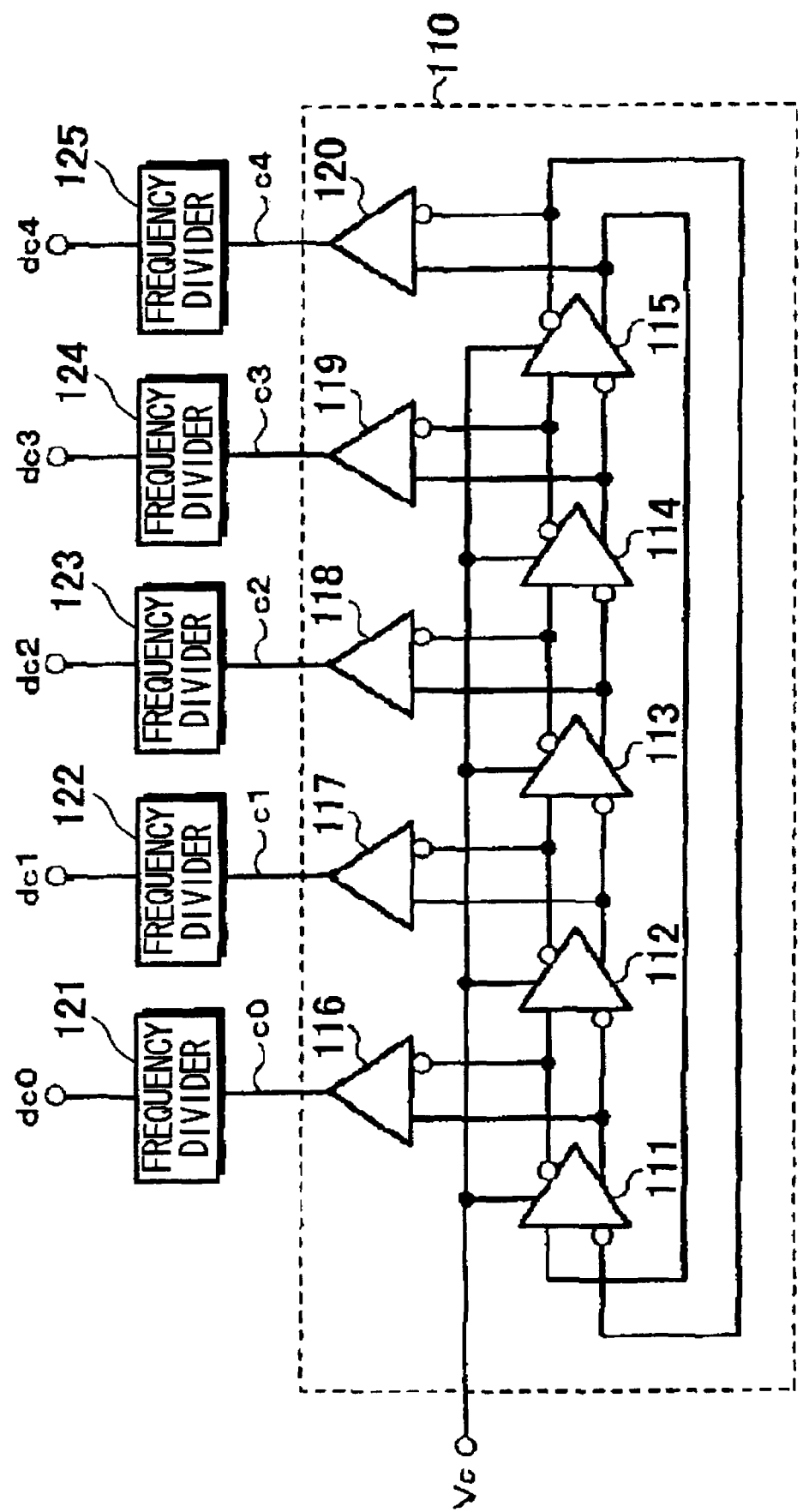
FIG. 12 is a diagram illustrating the configuration of a clock generator for generating a 5-phase clock using a ring oscillator according to the prior art.

Alternatively, an arrangement disclosed in FIG. 6, etc., of Patent Document 3 mentioned above may be used as the phase interpolator 4. One example of this is illustrated in FIG. 11. The phase interpolator illustrated in FIG. 11 delivers an output clock signal from an output terminal OUT. The output clock signal has a delay corresponding to an amount of phase obtained by internally dividing the phase difference of signals applied to inputs IN1 and IN2 using an internal dividing ratio decided by control signals S[0] to S[N−1] (SB[0] to SB[N−1] are signals obtained by inverting S[0] to S[N−1]). By assuming that the internal dividing ratio of the phase difference between the rising edges of the inputs IN1, IN2 is x:(1−x), adopting, e.g., x=0 and x=1 as the upper and lower limits, respectively, of the range of frequency fluctuation of the output clock and variably setting the internal dividing ratio x over the range of 0 to 1, the phase of the output clock is varied and the frequency modulated. A 2-phase clock comprising a signal obtained by frequency dividing a single-phase clock (the input clock from clock input terminal 1 in FIG. 1) by 2 and a signal that is the inverse of this signal may be supplied to the inputs IN1 and IN2. (In this case, the phase difference between the inputs IN1 and IN2 is the period $T_0$ of the input clock.) An overview of the circuit operation of the phase interpolator shown in FIG. 11 will now be described. When the input signals IN1 and IN2 are at the low level, a node N51 is charged via a PMOS transistor MP51 having a gate which receives the output of an OR gate 51. NMOS transistors MN31 to MN3N have the control signals S[0] to S[N−1], respectively, applied to their gates. At the rising edge of the input signal IN1, charge stored in the capacitor at node N51 is partially discharged via the paths of n-number of these NMOS transistors turned ON in response to their control signals attaining the high level. NMOS transistors MN41 to MN4N have the control signals SB[0] to SB[N−1], respectively, applied to their gates. At the rising edge of the input signal IN2, which lags behind the rising edge of input signal IN1, charge stored in the capacitor at node N51 is discharged via a total of N-number of paths of paths through (N−n)-number of these NMOS transistors turned ON in response to their control signals attaining the high level and paths through n-number of ON NMOS transistors among the NMOS transistors MN31 to MN3N. When the voltage at node N51 falls below a threshold value, the output of an inverter INV51 rises from the low to the high level. As a result, the phase of the output clock can be set variably in units of T/N, where T represents the phase difference between the inputs IN1 and IN2 and N is the divisor. It may be so arranged that the phase interpolator 4 generates the control signals S[0] to S[N−1] (thermometer codes) from the difference between the numbers of down signals 7 and up signals 6 that were output during the past number k of periods serving as the reference, at a timing decided by the timing signal 5 (see FIG. 6), with the output being held until the next timing signal 5 is output.

Though the present invention has been described in accordance with the foregoing embodiments, the invention is not limited to this embodiment and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A spread spectrum clock generating apparatus comprising:
    a phase interpolator for receiving an input clock signal and a control signal, varying phase of an output clock signal in accordance with said control signal to output the resultant output clock signal; and
    a control circuit for receiving and counting the input clock signal, generating said control signal, which is for varying the phase of the output clock signal and frequency-modulating the input signal, based upon result of the count, and supplying the generated control signal to said phase interpolator, wherein said control circuit, responsive to a frequency-modulation starting signal which is supplied thereto at any timing, starts output of said control signal, at a timing at which the frequency of the output clock signal is equal to the frequency of the input clock signal, and responsive to a frequency-modulation stop signal which is supplied thereto at any timing, stops output of said control signal, at a timing at which the frequency of the output clock signal is equal to the frequency of the input clock signal.

2. The apparatus according to claim 1, wherein said control circuit comprises a circuit for generating said control signal in such a manner that frequency of the output clock signal makes a round trip over a frequency range, stipulated by predetermined first and second frequencies of mutually different frequencies, in an interval that is a prescribed multiple of the period of the input clock signal, and supplying the generated control signal to said phase interpolator.

3. The apparatus according to claim 1, wherein said control circuit comprises a circuit for generating said control signal in such a manner that frequency of the output clock signal makes a round trip over a frequency range, stipulated by a second frequency higher by a prescribed amount than a predetermined first frequency and a third frequency lower by a prescribed amount than the first frequency, in an interval that is a prescribed multiple of the period of the input clock signal, and for supplying the generated control signal to said phase interpolator.

4. The apparatus according to claim 1, wherein said control signal includes an up signal which is for advancing the phase of the output clock and/or a down signal which is for retarding the phase of the output clock signal.

5. The apparatus according to claim 1, wherein said control signal includes an up signal which is for advancing the phase of the output clock a prescribed amount and a down signal which is for retarding the phase of the output clock signal a prescribed amount; and
    said control circuit comprises a circuit for exercising control so as to activate, a prescribed number of times, the up signal and/or down signal based upon the result of the count every prescribed number of periods predetermined with regard to the input clock signal, and supply the activated signal to said phase interpolator.

6. The apparatus according to claim 1, wherein said control circuit comprises:
    a frequency divider circuit for receiving the input clock signal and outputting a frequency-divided clock obtained by frequency dividing the input clock signal by a prescribed frequency dividing value;
    a first counter for receiving and counting the frequency-divided clock signal output from said frequency divider circuit and, when the frequency-divided clock signal has been counted up to a first predetermined value, outputting a first output signal and resetting the count value to zero;
    a second counter for receiving the first output signal from said first counter and counting the first output signal up and down between predetermined lower-limit and upper-limit count values;
    an up/down control circuit for receiving the frequency-divided clock signal from said frequency divider circuit and the count values of said first and second counters and outputting an up signal, which is for advancing the phase of the output clock, and/or a down signal, which is for retarding the phase of the output clock signal, to said phase interpolator as said control signal, based upon the count values of said first and second counters, at a timing stipulated by the frequency-divided clock signal;

a comparator circuit for receiving the count value of said first counter and the count value of said second counter, detecting that all of these count values have attained prescribed logic levels and outputting a detection signal indicative of result of the comparison; and an output control circuit for starting supply of the up signal and/or down signal to said phase interpolator in accordance with the detection signal after input of the frequency modulation start signal, and stopping supply of the up signal and/or down signal to said phase interpolator in accordance with the detection signal after input of the frequency modulation stop signal.

7. The apparatus according to claim 1, wherein said control signal includes a down signal which is for retarding the phase of the output clock signal a prescribed amount; and said control circuit comprises a circuit for exercising control so as to activate, a prescribed number of times, the down signal based upon the count every prescribed number of periods predetermined with regard to the input clock signal, and supply the activated signal to said phase interpolator.

8. The apparatus according to claim 1, wherein said control circuit comprises:

a frequency divider circuit for receiving the input clock signal and outputting a frequency-divided clock obtained by frequency dividing the input clock signal by a prescribed frequency dividing value;

a first counter for receiving and counting the frequency-divided clock output from said frequency divider circuit and, when the frequency-divided clock signal has been counted up to a first predetermined value, outputting a first output signal and resetting the count value to zero;

a second counter for receiving the first output signal from said first counter and counting the first output signal up and down between predetermined lower-limit and upper-limit count values;

a down control circuit for receiving the frequency-divided clock signal from said frequency divider circuit and the count values of said first and second counters and outputting a down signal, which is for retarding the phase of the output clock signal, to said phase interpolator as said control signal based upon the count values of said first and second counters, at a timing stipulated by the frequency-divided clock signal;

a comparator circuit for receiving the count value of said first counter and the count value of said second counter, detecting that all of these count values have attained prescribed logic levels and outputting a detection signal indicative of result of the comparison; and an output control circuit for starting supply of the down signal to said phase interpolator in accordance with the detection signal after input of the frequency modulation start signal, and stopping supply of the down signal to said phase interpolator in accordance with the detection signal after input of the frequency modulation stop signal.

9. The apparatus according to claim 1, wherein said control signal includes an up signal which is for advancing the phase of the output clock signal a prescribed amount; and said control circuit comprises a circuit for exercising control so as to activate, a prescribed number of times, the up signal based upon the count every prescribed number of periods predetermined with regard to the input clock signal, and supply the activated signal to said phase interpolator.

10. The apparatus according to claim 1, wherein said control circuit includes:

a frequency divider circuit for receiving the input clock signal and outputting a frequency-divided clock obtained by frequency dividing the input clock signal by a prescribed frequency dividing value;

a first counter for receiving and counting the frequency-divided clock output from said frequency divider circuit and, when the frequency-divided clock has been counted up to a first predetermined value, outputting a first output signal and resetting the count value to zero;

a second counter for receiving the first output signal from said first counter and counting the first output signal up and down between predetermined lower-limit and upper-limit count values;

an up control circuit for receiving the frequency-divided clock signal from said frequency divider circuit and the count values of said first and second counters and outputting an up signal, which is for advancing the phase of the output clock signal, to said phase interpolator as said control signal based upon the count values of said first and second counters, at a timing stipulated by the frequency-divided clock;

a comparator circuit for receiving the count value of said first counter and the count value of said second counter, detecting that all of these count values have attained prescribed logic levels and outputting a detection signal indicative of result of the comparison; and an output control circuit for starting supply of the up signal to said phase interpolator in accordance with the detection signal after input of the frequency modulation start signal, and stopping supply of the up signal to said phase interpolator in accordance with the detection signal after input of the frequency modulation stop signal.

11. The apparatus according to claim 1, wherein said phase interpolator comprises a circuit for retarding or advancing the phase of the output clock signal in accordance with said control signal, with a prescribed resolution serving as a unit of the period of the input clock signal.

12. A serial interface comprising the spread spectrum clock generating apparatus as set forth in claim 1.

* * * * *